(12) United States Patent
Brodkin et al.

(10) Patent No.: US 8,000,491 B2
(45) Date of Patent: Aug. 16, 2011

(54) TRANSDUCER DEVICE AND ASSEMBLY

(75) Inventors: Panu Brodkin, Tampere (FI); Tapio Liusvaara, Tampere (FI)

(73) Assignee: Nokia Corporation, Espoo (FI)

( * ) Notice: Subject to any disclaimer, the term of this patent is extended or adjusted under 35 U.S.C. 154(b) by 1331 days.

(21) Appl. No.: 11/585,717

(22) Filed: Oct. 24, 2006

(65) Prior Publication Data

US 2008/0094753 A1 Apr. 24, 2008

(51) Int. Cl.
*H04R 25/00* (2006.01)
*H04M 1/00* (2006.01)

(52) U.S. Cl. .................... 381/380; 379/433.01

(58) Field of Classification Search .................. 381/380; 379/419, 428.01, 430
See application file for complete search history.

(56) References Cited

U.S. PATENT DOCUMENTS

| | | | | |
|---|---|---|---|---|
| 6,426,143 | B1 * | 7/2002 | Voss et al. | 428/378 |
| 7,239,714 | B2 * | 7/2007 | de Blok et al. | 381/369 |
| 2006/0157841 | A1 | 7/2006 | Minervini | 257/680 |

FOREIGN PATENT DOCUMENTS

EP 0 303 384 A2 2/1989

* cited by examiner

*Primary Examiner* — Brian Ensey
(74) *Attorney, Agent, or Firm* — Harrington & Smith

(57) ABSTRACT

The invention concerns a transducer device and assembly. A transducer device and assembly according to the invention comprise sheet of electrical insulator covering connection pads of a transducer component. The sheet of electrical insulator has on its surface connection pads that have galvanic contacts with the connection pads of the transducer component. Inside or on a surface of the sheet of electrical insulator there are electrical conductors connected with the connection pads of the sheet of electrical insulator. With the aid of the sheet of electrical insulator equipped with the connection pads and electrical conductors the transducer component can be mounted to a wiring board in a desired orientation, i.e. the connection pads of the transducer component do not need to be against the wiring board.

46 Claims, 8 Drawing Sheets

TRANSDUCER DEVICE AND ASSEMBLY

FIELD OF THE INVENTION

The invention relates generally to electromechanical mounting of components of an electronic device. More particularly, the invention relates to mounting a transducer component into an electronic device.

BACKGROUND OF THE INVENTION

A typical electronic device comprises a wiring board, i.e. a circuit board, and electronic components mounted to a surface of the mentioned wiring board. Some of the electronic components can also be optical and/or electro-acoustical components like a microphone, a speaker, and an optoelectronic transducer. An electronic component has connection pads and/or connection legs with the aid of which the electronic component is mechanically fastened to a wiring board and electrically connected to electrical wires of the wiring board. Connection pads of an electronic component are fastened e.g. by soldering to connection pads of a wiring board. Connection legs of an electronic component are fastened e.g. by soldering to through-holes of a wiring board. An electrical component that is mounted to a wiring board with the aid of connection pads is typically called as a surface mounted device (SMD). Usually an SMD-component can have a smaller mechanical size than that of a corresponding electronic component having connection legs. Therefore, usage of SMD-components has become a commonly used solution for building electronic devices. When using a straightforward way to install an SMD-component to a wiring board, location of connection pads on a surface of an electronic component determines orientation of the electronic component on a surface of a wiring board. It is, however, possible that there is a need to install electronic components of a certain type, e.g. microphones, in different orientations with respect to a wiring board when installed to different electronic devices.

DESCRIPTION OF THE PRIOR ART

A solution according to the prior art is to provide different versions of an electronic component for different needs of installation. FIGS. 1a and 1b show perspective views of different versions 101 and 111 of a transducer component according to the prior art. The transducer component can be, for example, an electro-acoustical transducer or an optoelectronic transducer. The transducer component 101 shown in FIG. 1a has a signal aperture 103 on a region 104 of its outer surface and connection pads 102 on a different region 105 of its outer surface. In this transducer component the signal aperture and the connection pads are located on opposite sides of the transducer component. A transducer component 111 shown in FIG. 1b has a signal aperture 113 on a region 114 of its outer surface and connection pads 112 on the same region 114 of its outer surface. Therefore, in this transducer component the signal aperture and the connection pads are located on a same side of the transducer component.

FIG. 2a shows a side view of an assembly of the transducer component 101 on a surface of a wiring board. The transducer component 101 is electrically connected to electrical wires of the wiring board 201 via the connection pads 102. A two-headed arrow 202 represents a flow of optical or acoustical signal to or from the transducer component via the signal aperture 103. FIG. 2b shows a side view of an assembly of the transducer component 111 on a surface of a wiring board. The transducer component 111 is electrically connected to electrical wires of the wiring board 211 via the connection pads 112. The wiring board 211 has an aperture 213. The signal aperture 113 of the transducer component 111 is aligned with the aperture 213. A two-headed arrow 212 represents a flow of optical or acoustical signal to or from the transducer component via the signal aperture 113 and via the aperture 213.

The transducer component 101 shown in FIG. 1a is intended for the assembly shown in FIG. 2a but not for the assembly shown in FIG. 2b. Correspondingly, the transducer component 111 shown in FIG. 1b is intended for the assembly shown in FIG. 2b but not for the assembly shown in FIG. 2a. A product portfolio of a manufacturer of electronic devices can comprise many types of electronic devices. In some types of electrical devices that belong to the product portfolio the assembly shown in FIG. 2a may be used. On the other hand, in some other types of electrical devices that belong to the product portfolio the assembly shown in FIG. 2b may be used. From the viewpoint of the economy of large numbers in purchase of electronic components and in production management it would be advantageous if similar electronic components were suitable for different products.

BRIEF DESCRIPTION OF THE INVENTION

An objective of the present invention is to provide a transducer device such that drawbacks associated with the prior art are eliminated or reduced. A further objective of the present invention is to provide transducer assembly such that drawbacks associated with the prior art are eliminated or reduced. A further objective of the present invention is to provide communication device such that drawbacks associated with the prior art are eliminated or reduced. A further objective of the present invention is to provide a method for installing a transducer into an electronic device such that drawbacks associated with the prior art are eliminated or reduced.

The objectives of the invention are achieved with a sheet of electrical insulator that has on its surface connection pads and inside or on its surface electrical conductors connected to the connection pads. The sheet of electrical insulator is folded around a transducer component in such a way that the connection pads of the sheet of electrical insulator get against connection pads of the transducer component. The electrical conductors are disposed to have galvanic connections with electrical wires of a wiring board of an electronic device. With the aid of the sheet of electrical insulator equipped with the connection pads and electrical conductors the transducer component can be mounted to the wiring board in a desired orientation, i.e. the connection pads of the transducer component do not need to be against the wiring board.

The benefit provided by the present invention when compared with prior art solutions of the kind described above is the fact that similar transducer components can be used for different electronic devices in which transducer components needs to be mounted to a wiring board in different orientations.

A transducer device according to the invention is characterised in that it comprises:
- a transducer component having at least one connection pad on a first region of a surface of said transducer component,
- a sheet of electrical insulator disposed to be folded around said transducer component, at least a part of a surface of a first side of said sheet of electrical insulator being against at least a part of the surface of said transducer component,
- at least one first connection pad on the surface of the first side of said sheet of electrical insulator, said at least one first connection pad being against said at least one connection pad of said transducer component and having a galvanic contact with said at least one connection pad of said transducer component, at least one second connection pad on a surface of a second side of said sheet of electrical insulator, and at least one electrical conductor being in contact with said sheet of electrical insulator and adapted to form galvanic connection between said at least one first connection pad and said at least one second connection pad.

A transducer assembly according to the invention is characterised in that it comprises:

a wiring board having an aperture, a transducer component having at least one connection pad on a first region of a surface of said transducer component and a signal aperture on a second region of the surface of said transducer component, said second region being on an opposite side of said transducer component with respect to said first region, said second region facing towards said wiring board, and said signal aperture being aligned with said aperture of said wiring board, a sheet of electrical insulator disposed to cover at least partly said first region of the surface of said transducer component, at least a part of a surface of a first side of said sheet of electrical insulator being against said first region of the surface of said transducer component, at least one first connection pad on the surface of the first side of said sheet of electrical insulator, said at least one first connection pad being against said at least one connection pad of said transducer component and having a galvanic contact with said at least one connection pad of said transducer component, and at least one electrical conductor being in contact with said sheet of electrical insulator and adapted to have a galvanic contact with said at least one first connection pad.

A communication device according to the invention is characterised in that it comprises:

a wiring board having an aperture, a transducer component having a at least one connection pad on a first region of a surface of said transducer component and a signal aperture on a second region of the surface of said transducer component, said second region being on an opposite side of said transducer component with respect to said first region, said second region facing towards said wiring board, and said signal aperture being aligned with said aperture of said wiring board, a sheet of electrical insulator disposed to cover at least partly said first region of the surface of said transducer, at least a part of a surface of a first side of said sheet of electrical insulator being against said first region of the surface of said transducer component, at least one first connection pad on the surface of the first side of said sheet of electrical insulator, said at least one first connection pad being against said at least one connection pad of said transducer component and having a galvanic contact with said at least one connection pad of said transducer component, and at least one electrical conductor being in contact with said sheet of electrical insulator and adapted to have a galvanic contact with said at least one first connection pad.

A method according to the invention for installing a transducer into an electronic device is characterised in that it comprises:

installing a sheet of electrical insulator around said transducer component, at least a part of a surface of a first side of said sheet of electrical insulator getting against said transducer component and at least one first connection pad on the surface of the first side of said sheet of electrical insulator getting against at least one connection pad of said transducer component, and producing a galvanic contact between said at least one first connection pad and said at least one connection pad of said transducer component.

A number of embodiments of the invention are described in accompanied dependent claims.

The invention itself, however, both as to its construction and its method of operation, together with additional objects and advantages thereof, will be best understood from the following description of specific embodiments when read in connection with the accompanying drawings.

The exemplary embodiments of the invention presented in this document are not to be interpreted to pose limitations to the applicability of the appended claims. The verb "to comprise" is used in this document as an open limitation that does not exclude the existence of also unrecited features. The features recited in depending claims are mutually freely combinable unless otherwise explicitly stated.

BRIEF DESCRIPTION OF THE FIGURES

The invention and its other advantages are explained in greater detail below with reference to the preferred embodiments presented in the sense of examples and with reference to the accompanying drawings, in which.

DETAILED DESCRIPTION OF THE INVENTION

FIGS. 1a, 1b, 2a and 2b have been explained above in the description of the prior art. Therefore, the following discussion will focus on FIGS. 3a to 9.

Figure 1A:
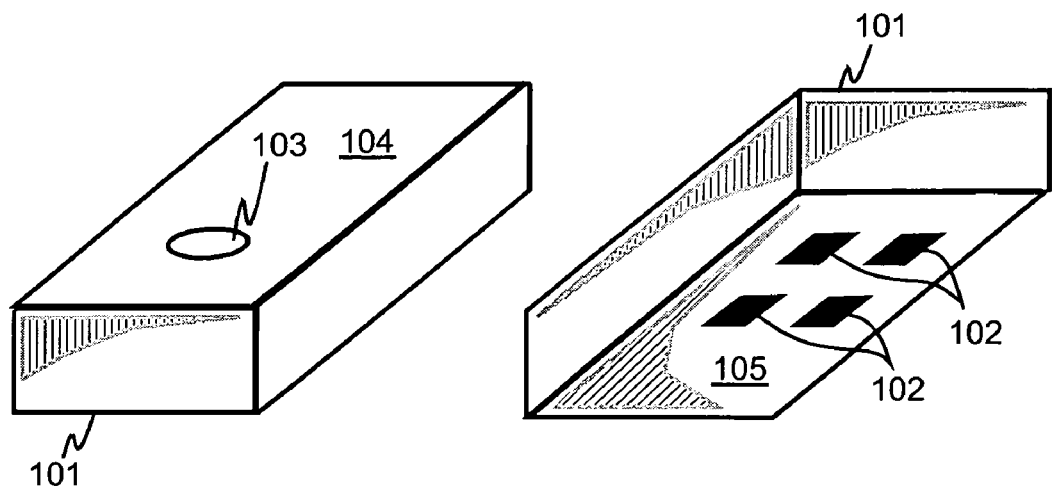
FIGS. 1a and 1b show perspective views of different versions of a transducer component according to the prior art.
Figure 1B:
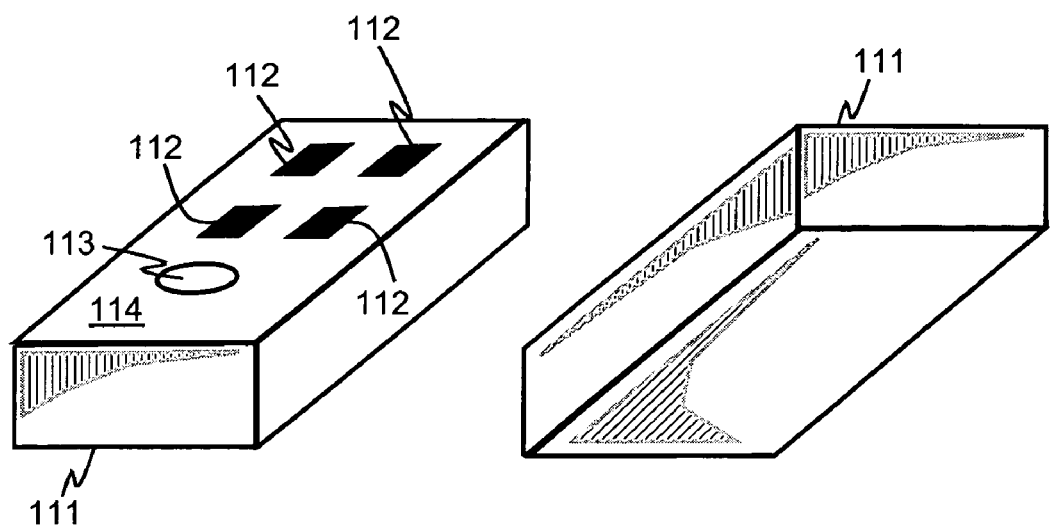
Figure 2A:
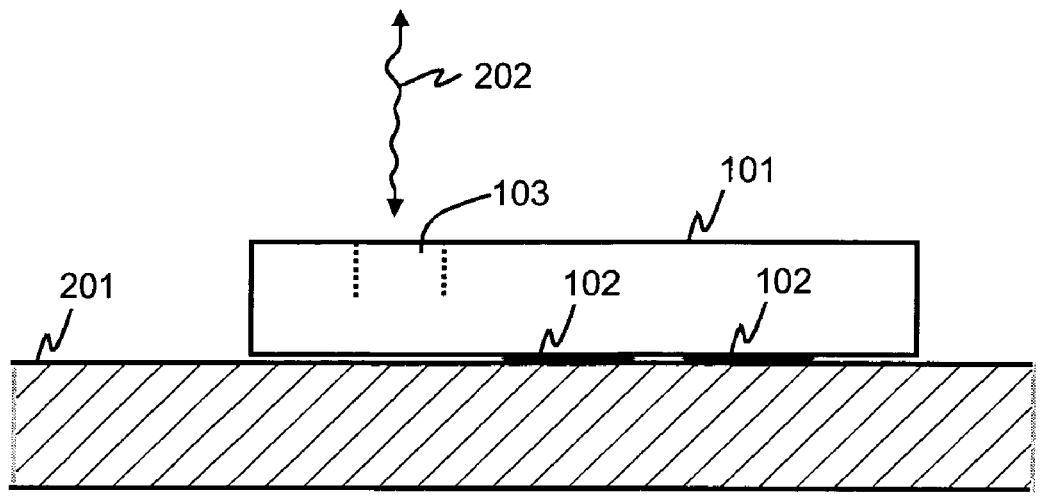
FIG. 2a shows a side view of an assembly of the transducer component shown in FIG. 1a on a surface of a wiring board.
Figure 2B:
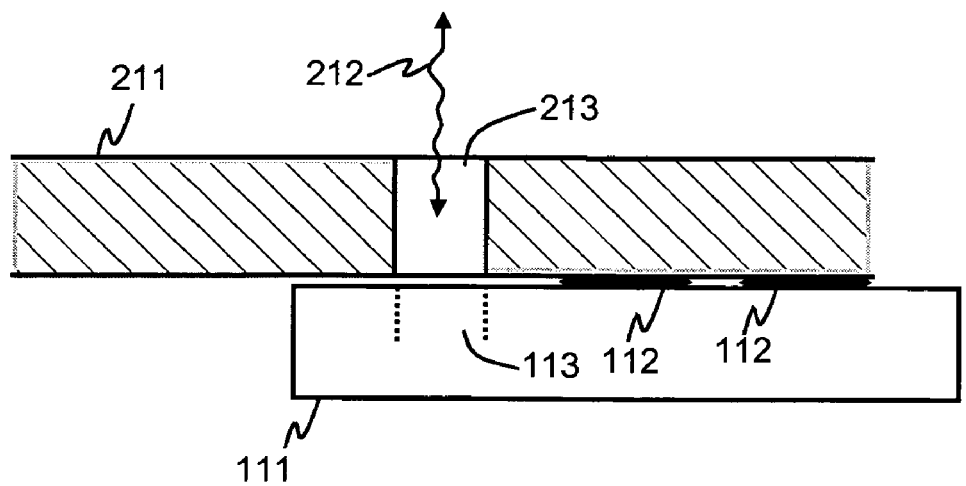
FIG. 2b shows a side view of an assembly of the transducer component shown in FIG. 1b on a surface of a wiring board.
Figure 3A:
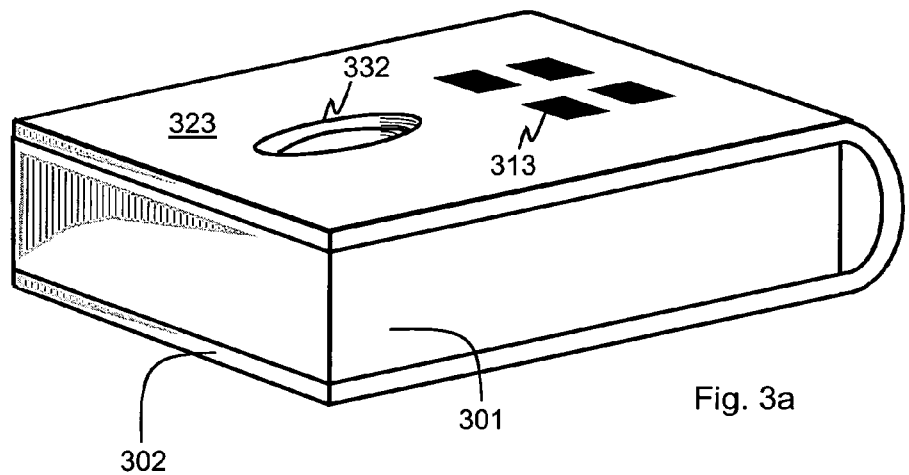
FIG. 3a shows a perspective view of a transducer device according to an embodiment of the invention.
Figure 3B:
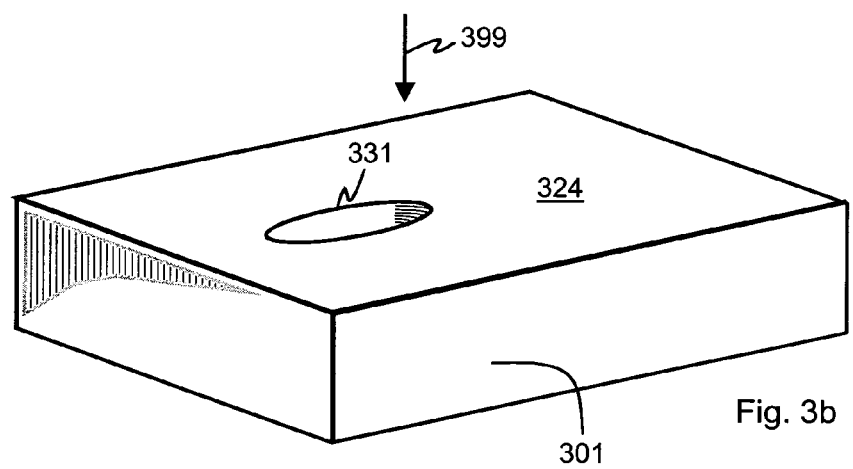
FIGS. 3b and 3c show two different perspective views of a transducer component that can be used in the transducer device shown in FIG. 3a, FIG. 3d shows a perspective view of a sheet of electrical insulator equipped with connection pads and electrical conductors.
Figure 3C:
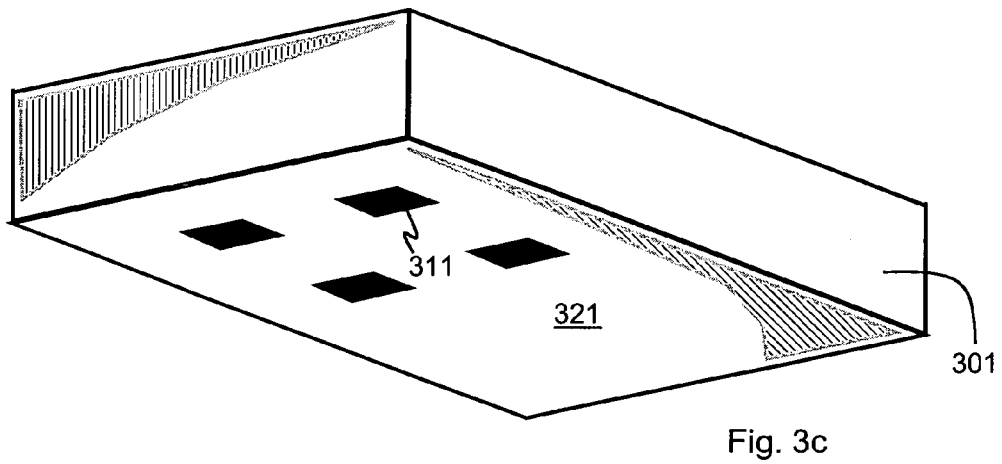
Figure 3D:
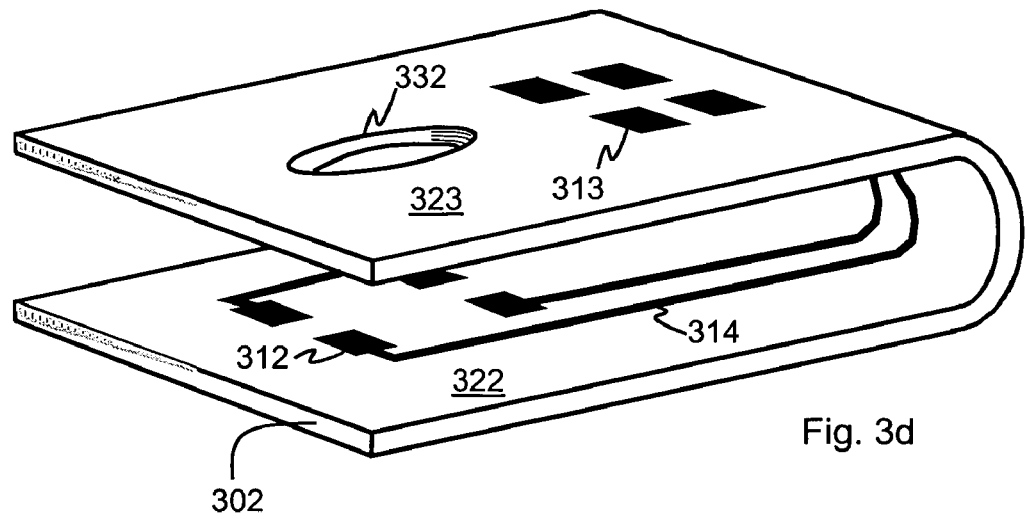

FIG. 3a shows a perspective view of a transducer device according to an embodiment of the invention. The transducer device comprises a transducer component 301 and a sheet of electrical insulator 302 disposed to be folded around the transducer component 301. FIGS. 3b and 3c show two different perspective views of the transducer component 301. The transducer component 301 has at least one connection pad 311 (FIG. 3c) on a first region 321 of the surface of the transducer component. FIG. 3d shows a perspective view of the sheet of electrical insulator 302 that is equipped with connection pads and electrical conductors. On a region 322 (FIG. 3d) on the surface of a first side of the sheet of electrical insulator 302 there is at least one first connection pad 312. In the transducer device, the connection pad 312 is arranged to be against the connection pad 311 of the transducer component and to have a galvanic contact with the connection pad 311 of the transducer component. On a region 323 (FIGS. 3a and 3d) on the surface of a second side of the sheet of electrical insulator 302 there is at least one second connection pad 313. In contact with the sheet of electrical insulator 302, i.e. inside the sheet of electrical insulator 302 or on the surface of the sheet of electrical insulator, there is at least one electrical conductor 314 (FIG. 3d) adapted to form a galvanic contact between the connection pad 312 and the connection pad 313. As the connection pad 312 and the connection pad 313 are located on opposite surfaces of the sheet of electrical insulator 302 the electrical conductor 314 has to go through the sheet of electrical insulator, i.e. a via-connection through the sheet of electrical insulator 302 is needed, or the electrical conductor has to go around an edge of the sheet of electrical insulator.

The sheet of electrical insulator that is equipped with connection pads and electrical conductors is preferably a flexible printed wiring board (flex-PWB) that can have adhesive material on its surface in order to fasten to the surface of the transducer component. Flexible printed wiring boards and connector tapes are handled e.g. in European patent application EP 0 303 384 A2 which is herein incorporated by reference. A connection pad can be, for example, a thin sheet of metal or electrically conductive polymer.

The above-text handled at least one connection pad 311 of the transducer, at least one connection pad 312 on the surface of the first side of the sheet of electrical insulator, and at least one connection pad 313 on the surface of the second side of the sheet of electrical insulator. In the exemplary transducer device illustrated in FIGS. 3a-3d there are four connection pads of the transducer, four connection pads on the surface of the first side of the sheet of electrical insulator, and four connection pads on the surface of the second side of the sheet of electrical insulator. Depending on a transducer component to be used, the numbers of connection pads on the surface of the transducer component and on the surfaces of a sheet of electrical insulator can vary.

In a transducer device according an embodiment of the invention the galvanic contact between the connection pad 311 and the connection pad 312 has been realized with one of the following welding methods: ultrasonic welding, laser welding, electron beam welding, and current pulse welding.

In a transducer device according an embodiment of the invention the galvanic contact between the connection pad 311 and the connection pad 312 has been realized with soldering.

In a transducer device according an embodiment of the invention the galvanic contact between the connection pad 311 and the connection pad 312 has been realized with printed electrically conductive adhesive material.

In a transducer device according an embodiment of the invention the galvanic contact between the connection pad 311 and the connection pad 312 has been realized with anisotropic electrically conductive adhesive material that has higher electrical conductivity in a direction perpendicular to the sheet of electrical insulator 302 than in a direction in the plane of the sheet of electrical insulator.

In the transducer device according to the embodiment of the invention illustrated in FIGS. 3a-3d a part of the sheet of electrical insulator 302 is disposed to cover at least partly a second region 324 (FIG. 3b) of the surface of the transducer component 301. The sheet of electrical insulator covers at least partly the region 324 of the surface of the transducer component when the transducer device is seen from a direction substantially perpendicular to the region 324 of the surface of the transducer component. The above-mentioned direction is illustrated with an arrow 399 in FIG. 3b.

In a transducer device according an embodiment of the invention the transducer component 301 comprises a signal aperture 331 on the second region 324 (FIG. 3b) of the surface of said transducer component. The signal aperture 331 is located on an opposite side of the transducer component with respect to the transducer connection pad 311 (FIG. 3c). The sheet of electrical insulator has an aperture 332 (FIG. 3a) that is aligned with the signal aperture 331.

In a transducer device according an embodiment of the invention the transducer component 301 is an electro-acoustical transducer and said signal aperture 331 is a sound signal port. The electro-acoustical transducer can be, for example, a microphone component or a speaker component. A microphone component can be, for example, a microelectromechanical system (MEMS) or a capacitor microphone, i.e. an electret microphone.

In a transducer device according an embodiment of the invention the transducer component is a pressure transducer and said signal aperture is a pressure signal port. The pressure transducer is adapted to generate an electrical signal that is proportional to a static or alternating pressure affecting to the transducer via the signal aperture.

In a transducer device according an embodiment of the invention the transducer component 301 is a speaker component and the signal aperture 331 is a sound signal port.

In a transducer device according an embodiment of the invention the transducer component 331 is an optoelectronic transducer and the signal aperture 331 is an optical signal port.

Figure 4A:
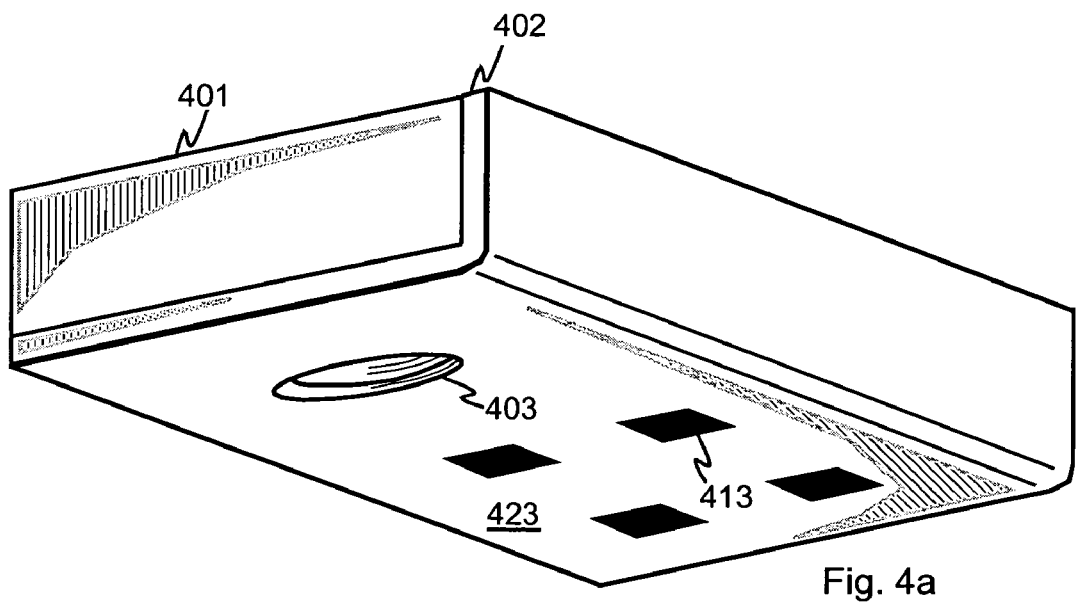
FIG. 4a shows a perspective view of a transducer device according to an embodiment of the invention.
Figure 4B:
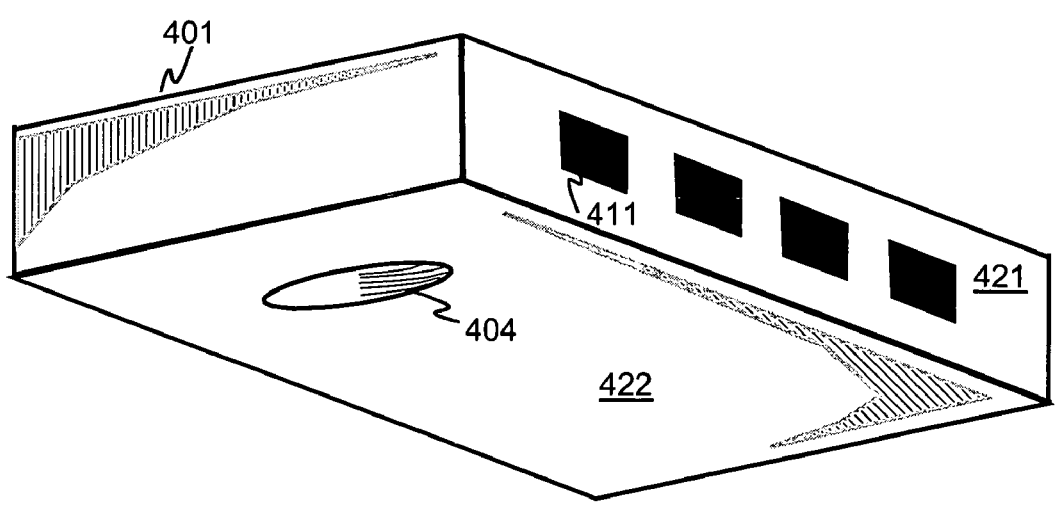
FIG. 4b shows a perspective view of a transducer component that can be used in the transducer device shown in FIG. 4a, FIG. 5a shows a perspective view of a transducer device according to an embodiment of the invention.

FIG. 4a shows a perspective view of a transducer device according to an embodiment of the invention and FIG. 4b shows a perspective view of a transducer component 401 of the transducer device. In this embodiment of the invention a sheet of electrical insulator 402 (FIG. 4a) is against a first region 421 and a second region 422 (FIG. 4b) of the surface of a transducer component 401. The transducer component 401 comprises at least one connection pad 411 (FIG. 4b) on the first region 421 of the surface of the transducer component. The sheet of electrical insulator 402 is equipped with at least one first connection pad on the surface of a first side of the sheet of electrical insulator 402. The at least one first connection pad is disposed to be against the at least one connection pad 411 of the transducer component. The at least one first connection pad is not shown in FIGS. 4a and 4b. On a region 423 (FIG. 4a) on the surface of a second side of the sheet of electrical insulator 402 there is at least one second connection pad 413. The sheet of electrical insulator 402 is equipped at least one electrical conductor that is disposed form a galvanic connection between the at least one second connection pad 413 and the at least one first connection pad. The at least one electrical conductor is not shown in FIGS. 4a and 4b.

The transducer component 401 can have a signal aperture 404 on the second region 422 of the surface of a transducer component and the sheet of electrical insulator 402 can have an aperture 403 that is aligned with the signal aperture 404.

It should be noticed that FIGS. 3a-3d and 4a-4b show only examples of transducer devices according to embodiments of the invention. Depending on a transducer component to be used, the connection pads and a possible signal aperture can be located in many different ways on the surface of the transducer component. Correspondingly, depending on a desired mounting orientation the connections pads on the surface of the second side of a sheet of electrical insulator can be located in many different ways.

Figure 5A:
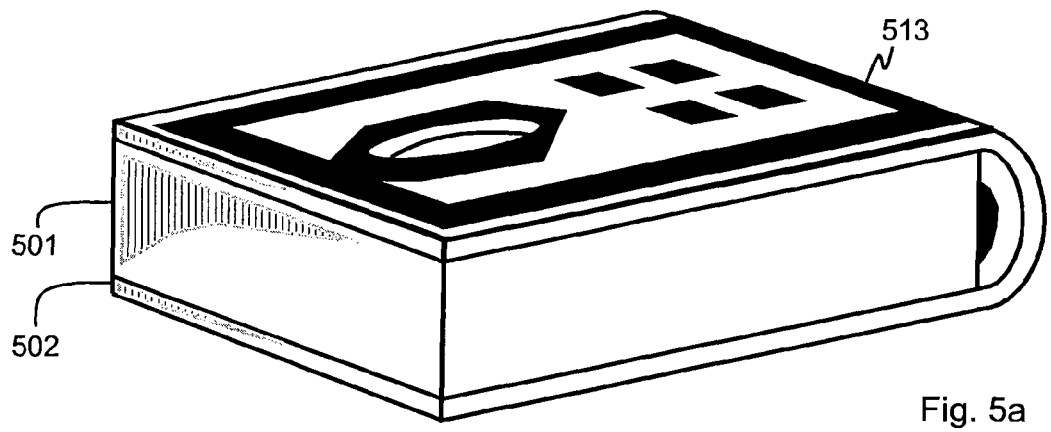
FIG. 5b shows a perspective view of a transducer component that can be used in the transducer device shown in FIG. 5a, FIGS. 5c and 5d show different perspective views of a sheet of electrical insulator equipped with connection pads and electrical conductors.
Figure 5B:
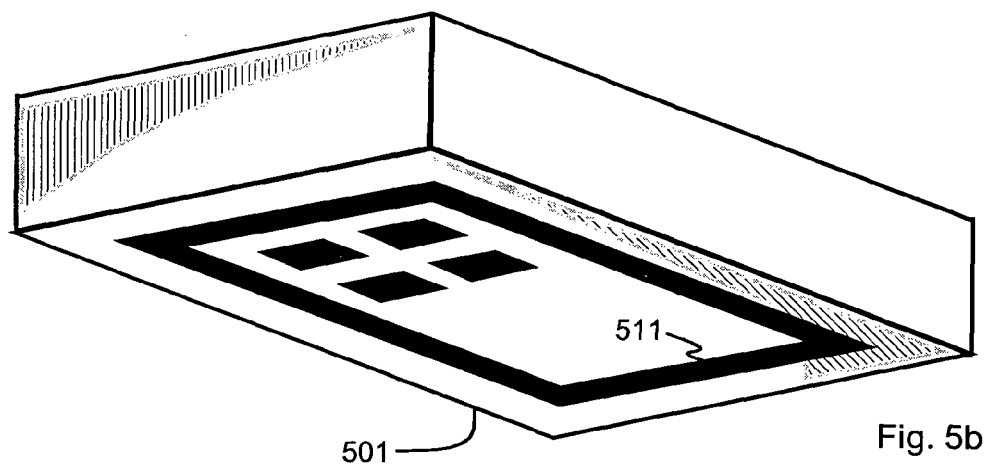

FIG. 5a shows a perspective view of a transducer device according to an embodiment of the invention. The transducer device comprises a transducer component 501 and a sheet of electrical insulator 502 equipped with connection pads and electrical conductors and disposed to be folded around the transducer component. The transducer component 501 whose perspective view is shown in FIG. 5b comprises an electrically conductive region 511 that surrounds connection pads. The electrically conductive region 511 can be used for protecting signals transmitted via the above-mentioned connection pads against electromagnetic interferences (EMI). The electrically conductive region 511 can be, for example, a thin sheet of metal or electrically conductive polymer on the surface of the transducer component 501.

Figure 5C:
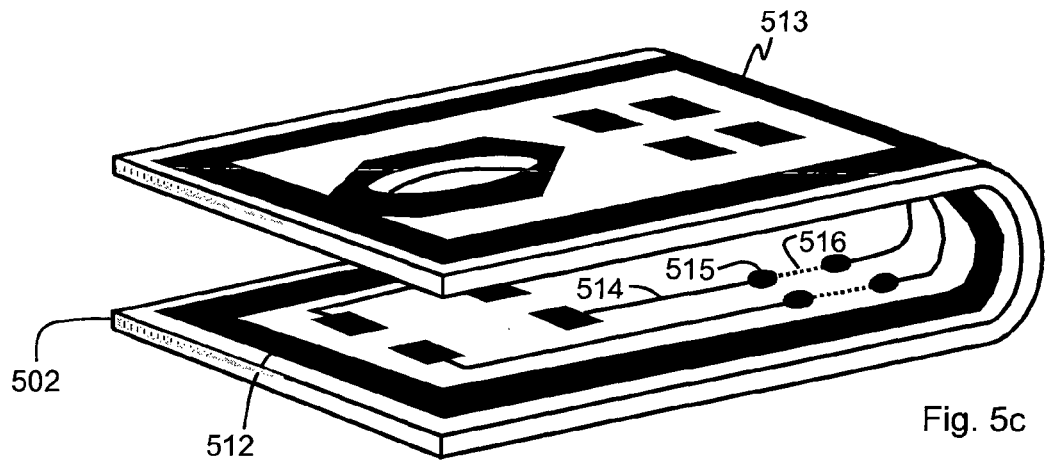
Figure 5D:
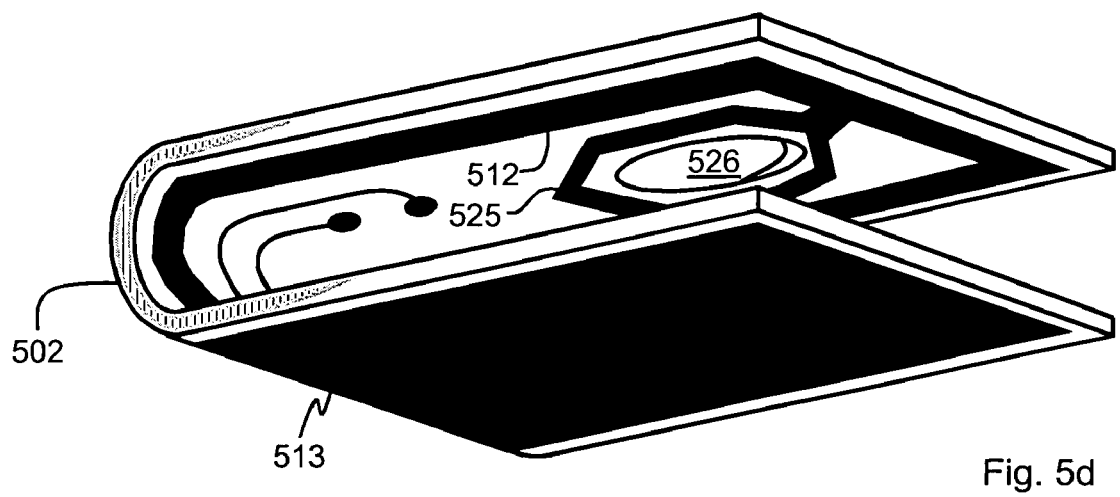

FIGS. 5c and 5d show different perspective views of the sheet of electrical insulator 502 equipped with connection pads and electrical conductors. On the surface of a first side of the sheet of electrical insulator 502 there is a first electrically conductive area 512 (FIGS. 5c and 5d) and on the surface of a second side of the sheet of electrical insulator 502 there is a second electrically conductive area 513 (FIGS. 5a, 5c, and 5d) that surrounds connector pads. The electrically conductive areas 512 and 513 can be, for example, thin sheets of metal or electrically conductive polymer on the surfaces of the sheet of electrical insulator 502.

Electrical conductors that are adapted to form galvanic contacts between first and second connection pads on the surfaces of the first and second sides of the sheet of electrical insulator 502, respectively, are arranged in such a way that the electrical conductors are not electrically connected to each other via the conductive region 511 (FIG. 5b) on the surface of the transducer. In FIG. 5c a part of an electrical conductor 514 is arranged to be inside the sheet of electrical insulator 502. A black dot 515 represent a via-connection and a dashed line 516 represents the part of the electrical conductor 514 that is inside the sheet of electrical insulator 502.

A transducer device according an embodiment of the invention comprises an electrical conductor adapted to form a galvanic connection between the electrically conductive area 512 and the electrically conductive area 513.

In a transducer device according an embodiment of the invention the electrically conductive areas 512 and 513 are disposed to cover same areas of the sheet of electrical insulator 502. In this embodiment of the invention a conductor disposed to form a galvanic connection between the electrically conductive area 512 and the electrically conductive area 513 can consist of one or more via-connections through the sheet of electrical insulator 502 between the electrically conductive areas 512 and 513.

In a transducer device according an embodiment of the invention the transducer component 501 comprises a signal aperture (not shown) that is surrounded by an electrically conductive region (not shown) on the surface of the transducer component. The sheet of electrical insulator 502 comprises an aperture 526 (FIG. 5d) that is surrounded by an electrically conductive region 525 on a surface of the sheet of electrical insulator. A signal aperture sealing between the transducer component 501 and the sheet of electrical insulator 502 has been realized by soldering the electrically conductive region 525 to the electrically conductive region surrounding the signal aperture on the surface of the transducer component.

In a transducer device according an embodiment of the invention the transducer component 501 comprises a signal aperture (not shown) and the sheet of electrical insulator 502 comprises an aperture 526 (FIG. 5d) that is surrounded by adhesive material. The adhesive material is disposed to form a signal aperture sealing between the transducer component 501 and the sheet of electrical insulator 502.

In a transducer device according an embodiment of the invention the transducer component 501 comprises a signal aperture (not shown) and the sheet of electrical insulator 502 comprises an aperture 526 (FIG. 5d) and a ring-shaped gasket of flexible material surrounding the aperture 526. The gasket is disposed to form a signal aperture sealing between the transducer component 501 and the sheet of electrical insulator 502. The gasket can be made, for example, of rubber.

In light of the above-described examples it is obvious that a sheet of electrical insulator can be wrapped around a transducer component in many different ways. In the extreme case the sheet of electrical insulator has projections that can be folded around the transducer in such a way that the sheet of electrical insulator encloses the transducer from all sides. With having electrically conductive material inside the sheet of electrical insulator or on the surface of the sheet of electrical insulator it is possible to surround the transducer component with a Faraday's cage that protects input and/or output electrical signals of the transducer component from adverse effects of electromagnetic interference (EMI).

Figure 6:
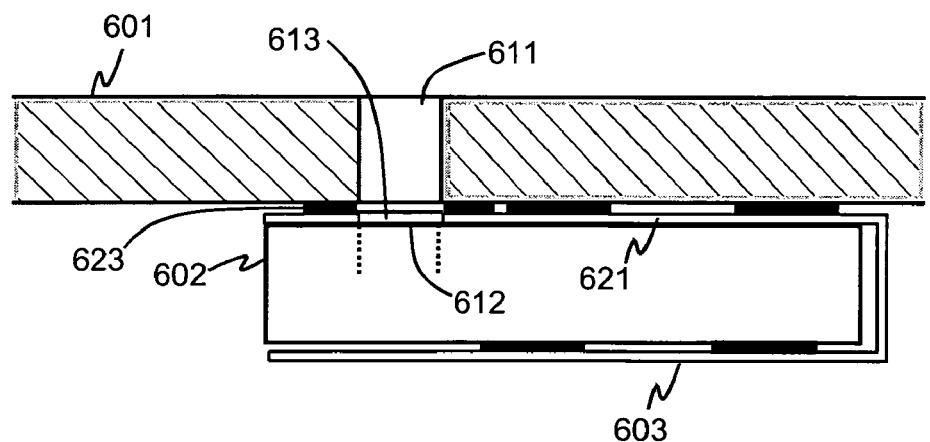
FIG. 6 shows a side view of a transducer assembly according to an embodiment of the invention.

FIG. 6 shows a side view of a transducer assembly according to an embodiment of the invention. The transducer assembly comprises a wiring board 601 having an aperture 611 and a transducer component 602 having at least one connection pad on a first region of a surface of the transducer component and a signal aperture 612 on a second region of the surface of the transducer component. The second region is on an opposite side of the transducer component with respect to the first region. The second region faces towards the wiring board 601 and the signal aperture 612 is aligned with the aperture 611 of the wiring board. The transducer assembly comprises a sheet of electrical insulator 603 disposed to cover at least partly the first region of the surface of the transducer component in a direction that substantially perpendicular to the first region of the surface of the transducer component. The side of the sheet of electrical insulator that is against the transducer component is called a first side of the sheet of electrical insulator and the opposite side of the sheet of electrical insulator is called a second side. The transducer assembly comprises at least one first connection pad on the surface of the first side of the sheet of electrical insulator. The at least one first connection pad is against the at least one connection pad of the transducer component and has a galvanic contact with the at least one connection pad of the transducer component.

A part 621 of the sheet of electrical insulator 603 is between the transducer component 602 and the wiring board 601. The transducer assembly comprises at least one second connection pad on a surface of the part 621 of the sheet of electrical insulator and at least one connection pad on a surface of the wiring board. The at least one second connection pad is against the at least one connection pad of the wiring board and there is a galvanic contact between the at least one connection pad of the wiring board and the at least one second connection pad. The transducer assembly comprises in contact with the sheet of electrical insulator 603, i.e. on the surface of the sheet of electrical insulator or inside the sheet of electrical insulator, at least one electrical conductor that is disposed to form a galvanic connection between the at least one second connection pad and the at least one first connection pad.

The above-text handled at least one connection pad of the transducer, at least one connection pad on the surface of the first side of the sheet of electrical insulator, and at least one connection pad on the surface of the second side of the sheet of electrical insulator. Depending on a transducer component to be used, the numbers of connection pads on the surface of the transducer component and on the surfaces of a sheet of electrical insulator can vary.

A transducer assembly according to an embodiment of the invention comprises:
- on the first region of the surface of the transducer component 602 an electrically conductive region that surrounds the at least one connection pad of the transducer component,
- on the surface of the first side of the sheet of electrical insulator 603 a first electrically conductive area, and
- on the surface of the second side of the sheet of electrical insulator 603 a second electrically conductive area.

A transducer assembly according to an embodiment of the invention comprises one or more electrical conductors adapted to form a galvanic connection between the first electrically conductive area, the second electrically conductive area, and a ground plane of said wiring board. Therefore, a Faraday's cage can be provided around the transducer component 602.

In a transducer assembly according an embodiment of the invention the transducer component 602 is an electro-acoustical transducer and said signal aperture 612 is a sound signal port. The electro-acoustical transducer can be, for example, a microphone component or a speaker component. A microphone component can be, for example, a microelectromechanical system (MEMS) or a capacitor microphone, i.e. an electret microphone.

In a transducer assembly according an embodiment of the invention the transducer component 602 is a pressure transducer and said signal aperture 612 is a pressure signal port. The pressure transducer is adapted to generate an electrical signal that is proportional to a static or alternating pressure affecting to the transducer via the signal aperture.

In a transducer assembly according to an embodiment of the invention the transducer component 602 is an optoelectronic transducer and the signal aperture 612 is an optical signal port.

In a transducer assembly according to an embodiment of the invention the sheet of electrical insulator 603 comprises an aperture 613 that is aligned with the signal aperture 612.

In a transducer assembly according to an embodiment of the invention comprises a ring-shaped gasket 623 disposed to form a signal aperture sealing between the sheet of electrical insulator 603 and the wiring board 601.

Figure 7:
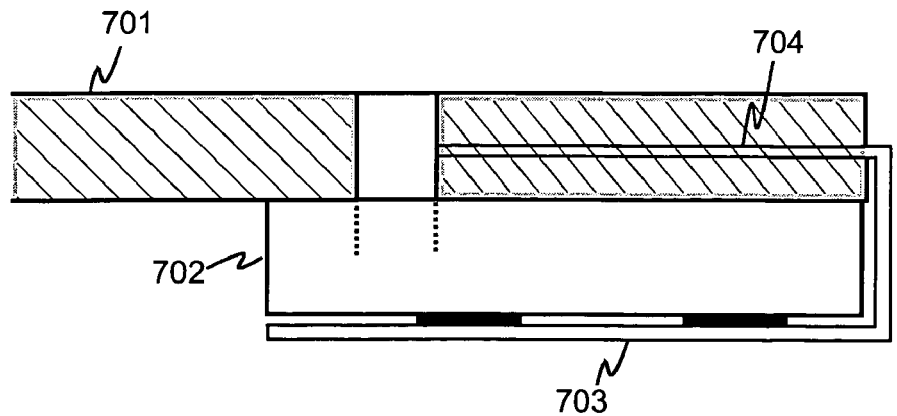
FIG. 7 shows a side view of a transducer assembly according to an embodiment of the invention.

FIG. 7 shows a side view of a transducer assembly according to an embodiment of the invention. In this embodiment of the invention a sheet of electrical insulator 703 that is disposed to cover a transducer component 702 is a flexible overhang of a layer 704 of a wiring board 701 (a flex-rigid-wiring board). Connection pads on the surface of the sheet of electrical insulator 703 can be directly connected to wires of the wiring board 701.

Figure 8:
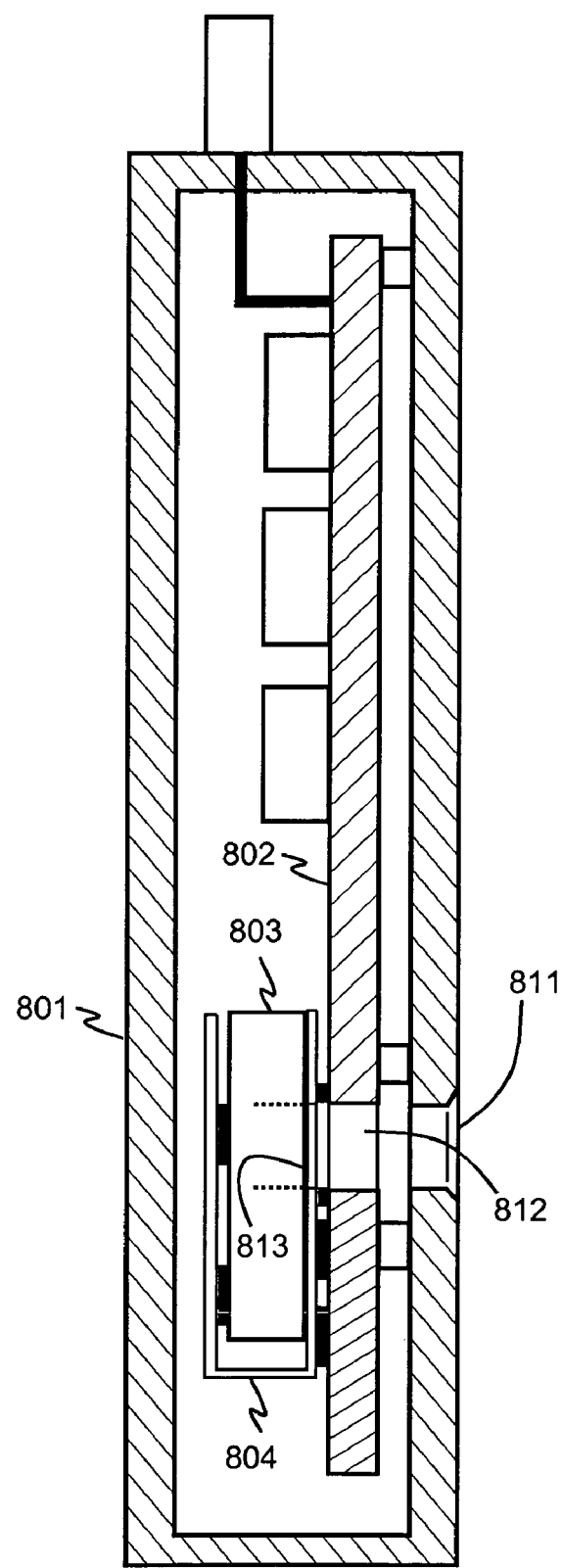
FIG. 8 shows a schematic section view of a communication device according to an embodiment of the invention.

FIG. 8 shows a schematic section view of a communication device according to an embodiment of the invention. The communication device comprises a case 801 having an aperture 811 and a wiring board 802 having an aperture 812. The communication device comprises a transducer component 803 having at least one connection pad on a first region of the surface of the transducer component and a signal aperture 813 on a second region of the surface of the transducer component. The second region is on an opposite side of the transducer component 803 with respect to the first region and the second region is facing towards the wiring board 802. The signal aperture 813 of the transducer component is aligned with the aperture 812 of the wiring board 802. The communication device comprises a sheet of electrical insulator 804 disposed to cover at least partly the first region of the surface of the transducer component 803 in a direction substantially perpendicular to the first region of the surface of the transducer component. The side of the sheet of electrical insulator 804 that is against the transducer component 803 is called a first side of the sheet of electrical insulator and the opposite side of the sheet of electrical insulator is called a second side. The communication device comprises at least one first connection pad on the surface of the first side of said sheet of electrical insulator. The at least one first connection pad is against the at least one connection pad of the transducer component and has a galvanic contact with the at least one connection pad of the transducer component.

A part of the sheet of electrical insulator 804 is between the transducer component 803 and the wiring board 802. The communication device comprises at least one second connection pad on a surface of the above-mentioned part of the sheet of electrical insulator and at least one connection pad on a surface of the wiring board. The at least one second connection pad is against the at least one connection pad of the wiring board and there is a galvanic contact between the at least one connection pad of the wiring board and the at least one second connection pad. The transducer assembly comprises in contact with the sheet of electrical insulator 804, i.e. on the surface of the sheet of electrical insulator or inside the sheet of electrical insulator, at least one electrical conductor that is disposed to form a galvanic connection between the at least one second connection pad and the at least one first connection pad.

The communication device described above and shown in FIG. 8 comprises a transducer assembly of the kind illustrated in FIG. 6. A communication device according to an alternative embodiment of the invention comprises a transducer assembly of the kind illustrated in FIG. 7.

In a communication device according an embodiment of the invention the transducer component 803 is an electro-acoustical transducer and said signal aperture 813 is a sound signal port. The electro-acoustical transducer can be, for example, a microphone component or a speaker component. A microphone component can be, for example, a microelectromechanical system (MEMS) or a capacitor microphone, i.e. an electret microphone.

In a communication device according an embodiment of the invention the transducer component 803 is a pressure transducer and said signal aperture 813 is a pressure signal port. The pressure transducer is adapted to generate an electrical signal that is proportional to a static or alternating pressure affecting to the transducer via the signal aperture.

In a communication device according an embodiment of the invention the transducer component 803 is an optoelectronic transducer and said signal aperture 813 can be an optical signal port. The optoelectronic transducer can be, for example, an infrared transducer, a visible light transducer, a LED-transducer (Light Emitting Diode), a laser-transducer, or a phototransistor transducer.

In a communication device according an embodiment of the invention the transducer component 803 is an avalanche-diode transducer.

In a communication device according an embodiment of the invention the transducer component 803 is a PIN-diode transducer (P-layer, Intrinsic layer, N-layer-diode).

In a communication device according an embodiment of the invention the transducer component 803 is a VDR-diode transducer (Voltage Dependent Resistor).

In a communication device according an embodiment of the invention the aperture 811 is adapted to be plug-in hole for a fiber or for a waveguide.

A communication device according to an embodiment of the invention is a mobile phone.

A communication device according to an embodiment of the invention is a handheld computer, i.e. a palmtop computer.

A communication device according to an embodiment of the invention is a portable computer, i.e. a laptop computer.

A communication device according to an embodiment of the invention comprises a membrane disposed to cover the aperture 811 of the case 801. The membrane protects the transducer device against adverse effects of impurities and mechanical particles.

Figure 9:
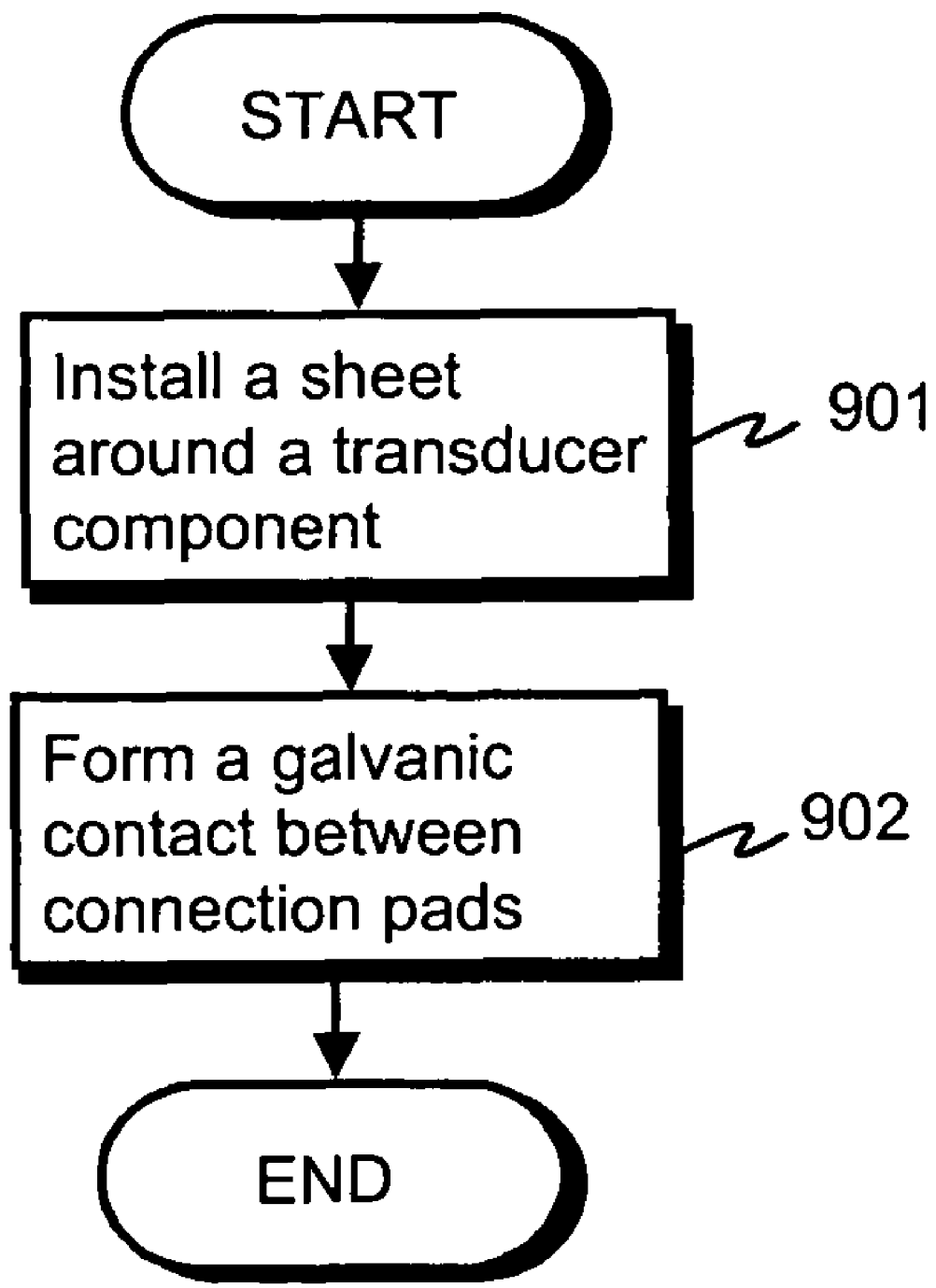
FIG. 9 is a flow chart of a method according to an embodiment of the invention for installing a transducer into an electronic device.

FIG. 9 is a flow chart of a method according to an embodiment of the invention for installing a transducer into an electronic device. The method comprises:

- installing (901) a sheet of electrical insulator around the transducer component, at least a part of the surface of a first side of the sheet of electrical insulator getting against the transducer component and at least one first connection pad on the surface of the first side of the sheet of electrical insulator getting against at least one connection pad of the transducer component, and
- producing (902) a galvanic contact between the at least one first connection pad and the at least one connection pad of the transducer component.

In a method according to an embodiment of the invention the sheet of electrical insulator is an overhang of a layer of a wiring board of the electronic device and the at least one first connection pad has a galvanic connection with an electrical conductor of the wiring board.

In a method according to an alternative embodiment of the invention a part of the sheet of electrical insulator is laid between the transducer component and a wiring board of the electronic device, at least one second connection pad on a surface of the part of the sheet of electrical insulator is laid against at least one connection pad of the wiring board, and a galvanic contact is produced between the at least one second connection pad and the at least one connection pad of the wiring board. The at least one connection pad of the wiring board is located on a surface of the wiring board and the at least one second connection pad has a galvanic connection with the at least one first connection pad.

In the above-described method, galvanic contacts between different pairs of connections pads that are against each other can be produced in various temporal orders. For example, in a method according to an exemplary embodiment of the invention, the galvanic contact between the at least one first connection pad and the at least one connection pad of the transducer component is produced at first and then the galvanic contact between the at least one second connection pad and the at least one connection pad of the wiring board is produced. In a method according to another exemplary embodiment of the invention, the galvanic contact between the at least one first connection pad and the at least one connection pad of the transducer component is produced after the galvanic contact between the at least one second connection pad and the at least one connection pad of the wiring board has been produced.

A galvanic contact between a pair of connection pads that are against each other can be produced using different methods known by a person skilled to art. Furthermore, a different method can be used for different pairs of connection pads. Examples of methods that can be used for producing a galvanic contact are given in the text below.

In a method according to an embodiment of the invention the galvanic contact between the at least one connection pad of the transducer component and the at least one first connection pad is produced with one of the following welding methods: ultrasonic welding, laser welding, electron beam welding, and current pulse welding.

In a method according to an embodiment of the invention the galvanic contact between the at least one second connection pad and the at least one connection pad of the wiring board is produced with one of the following welding methods: ultrasonic welding, laser welding, electron beam welding, and current pulse welding.

In a method according to an embodiment of the invention the galvanic contact between the at least one connection pad of the transducer component and the at least one first connection pad is produced with soldering.

In a method according to an embodiment of the invention the galvanic contact between the at least one connection pad of the transducer component and the at least one first connection pad is produced with printed electrically conductive adhesive material.

In a method according to an embodiment of the invention the galvanic contact between the at least one connection pad of the transducer component and the at least one first connection pad is produced with anisotropic electrically conductive adhesive material.

In a method according to an embodiment of the invention the galvanic contact between the at least one second connection pad and the at least one connection pad of the wiring board is produced with soldering.

In a method according to an embodiment of the invention the galvanic contact between the at least one second connection pad and the at least one connection pad of the wiring board is produced with printed electrically conductive adhesive material.

In a method according to an embodiment of the invention the galvanic contact between the at least one second connection pad and the at least one connection pad of the wiring board is produced with anisotropic electrically conductive adhesive material.

While there have been shown and described and pointed out fundamental novel features of the invention as applied to preferred embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the independent claims appended hereto. The specific examples provided in the description given above should not be construed as limiting. Therefore, the invention is not limited merely to the embodiments described above, many variants being possible without departing from the scope of the inventive idea defined in the independent claims.

What is claimed is:

1. An apparatus comprising:
    a transducer component having at least one connection pad on a first region of a surface of said transducer component, where said transducer component is configured to convert input energy in a first form into output energy of a second different form,
    a sheet of electrical insulator disposed to be folded around said transducer component, at least a part of a surface of a first side of said sheet of electrical insulator being against at least a part of the surface of said transducer component,
    at least one first connection pad on the surface of the first side of said sheet of electrical insulator, said at least one first connection pad being against said at least one connection pad of said transducer component and having a galvanic contact with said at least one connection pad of said transducer component,
    at least one second connection pad on a surface of a second side of said sheet of electrical insulator, and
    at least one electrical conductor being in contact with said sheet of electrical insulator and adapted to form a galvanic connection between said at least one first connection pad and said at least one second connection pad.

2. An apparatus according to claim 1, wherein said transducer component comprises a signal aperture on a second region of the surface of said transducer component, said signal aperture being on an opposite side of the transducer component with respect to said transducer connection pad.

3. An apparatus according to claim 2, wherein a part of said sheet of electrical insulator is disposed to cover at least partly said second region of the surface of said transducer component, said part of said sheet of electrical insulator having an aperture aligned with said signal aperture.

4. An apparatus according to claim 1, comprising:
    on said first region of the surface of said transducer component an electrically conductive region surrounding said at least one connection pad of said transducer component,
    on the surface of the first side of said sheet of electrical insulator a first electrically conductive area, and
    on the surface of the second side of said sheet of electrical insulator a second electrically conductive area surrounding said at least one second connection pad.

5. An apparatus according to claim 4, comprising an electrical conductor adapted to form a galvanic connection between said first electrically conductive area and said second electrically conductive area.

6. An apparatus according to claim 1, wherein said galvanic contact between said at least one connection pad of said transducer component and said at least one first connection pad has been realized with one of the following welding methods: ultrasonic welding, laser welding, electron beam welding, and current pulse welding.

7. An apparatus according to claim 1, wherein said galvanic contact between said at least one connection pad of said transducer component and said at least one first connection pad has been realized with soldering.

8. An apparatus according to claim 1, wherein said galvanic contact between said at least one connection pad of said transducer component and said at least one first connection pad has been realized with printed electrically conductive adhesive material.

9. An apparatus according to claim 1, wherein said galvanic contact between said at least one connection pad of said transducer component and said at least one first connection pad has been realized with anisotropic electrically conductive adhesive material.

10. An apparatus according to claim 2, wherein said transducer component is an electro-acoustical transducer and said signal aperture is a sound signal port.

11. An apparatus according to claim 10, wherein said electro-acoustical transducer is a microphone component.

12. An apparatus according to claim 10, wherein said electro-acoustical transducer is a speaker component.

13. An apparatus according to claim 2, wherein said transducer component is a pressure transducer and said signal aperture is a pressure signal port.

14. An apparatus according to claim 2, wherein said transducer component is an optoelectronic transducer and said signal aperture is an optical signal port.

15. A transducer assembly comprising:
    a wiring board having an aperture,
    a transducer component having at least one connection pad on a first region of a surface of said transducer component and a signal aperture on a second region of the surface of said transducer component, said second region being on an opposite side of said transducer component with respect to said first region, said second region facing towards said wiring board, and said signal aperture being aligned with said aperture of said wiring board,
    a sheet of electrical insulator disposed to cover at least partly said first region of the surface of said transducer component, at least part of a surface of a first side of said sheet of electrical insulator being against said first region of the surface of said transducer component,
    at least one first connection pad on the surface of the first side of said sheet of electrical insulator, said at least one first connection pad being against said at least one connection pad of said transducer component and having a galvanic contact with said at least one connection pad of said transducer component, and
    at least one electrical conductor being in contact with said sheet of electrical insulator and adapted to have a galvanic contact with said at least one first connection pad.

16. A transducer assembly according to claim 15, wherein said sheet of electrical insulator is a flexible overhang of a layer of said wiring board and said at least one electrical conductor is adapted to have a galvanic contact with an electrical conductor of said wiring board.

17. A transducer assembly according to claim 15, wherein a part of said sheet of electrical insulator is between said transducer component and said wiring board, and the transducer assembly comprises at least one second connection pad on a surface of said part of said sheet of electrical insulator and at least one connection pad on a surface of said wiring board, said at least one second connection pad being against said at least one connection pad of said wiring board, having a galvanic contact with said connection pad of said wiring board, and having a galvanic contact with said at least one electrical conductor.

18. A transducer assembly according to claim 15, comprising:
- on said first region of the surface of said transducer component an electrically conductive region surrounding said at least one connection pad of said transducer component,
- on the surface of the first side of said sheet of electrical insulator a first electrically conductive area, and
- on a surface of a second side of said sheet of electrical insulator a second electrically conductive area.

19. A transducer assembly according to claim 18, comprising an electrical conductor adapted to form a galvanic connection between said first electrically conductive area, said second electrically conductive area, and a ground plane of said wiring board.

20. A transducer assembly according to claim 15, wherein said transducer component is an electro-acoustical transducer and said signal aperture is a sound signal port.

21. A transducer assembly according to claim 20, wherein said electro-acoustical transducer is a microphone component.

22. A transducer assembly according to claim 20, wherein said electro-acoustical transducer is a speaker component.

23. A transducer assembly according to claim 15, wherein said transducer component is an optoelectronic transducer and said signal aperture is an optical signal port.

24. A transducer assembly according to claim 15, wherein said transducer component is a pressure transducer and said signal aperture is a pressure signal port.

25. A communication device comprising:
- a wiring board having an aperture,
- a transducer component having at least one connection pad on a first region of a surface of said transducer component and a signal aperture on a second region of the surface of said transducer component, said second region being on an opposite side of said transducer component with respect to said first region, said second region facing towards said wiring board, and said signal aperture being aligned with said aperture of said wiring board,
- a sheet of electrical insulator disposed to cover at least partly said first region of the surface of said transducer component, at least part of a surface of a first side of said sheet of electrical insulator being against said first region of the surface of said transducer component,
- at least one first connection pad on the surface of the first side of said sheet of electrical insulator, said at least one first connection pad being against said connection pad of said transducer component and having a galvanic contact with said connection pad of said transducer component, and
- at least one electrical conductor being in contact with said sheet of electrical insulator and adapted to have a galvanic contact with said at least one first connection pad.

26. A communication device according to claim 25, wherein said sheet of electrical insulator is an overhang of a layer of said wiring board and said at least one electrical conductor is adapted to have a galvanic contact with an electrical conductor of said wiring board.

27. A communication device according to claim 25, wherein a part of said sheet of electrical insulator is between said transducer component and said wiring board, and the transducer assembly comprises at least one second connection pad on a surface of said part of said sheet of electrical insulator and at least one connection pad on a surface of said wiring board, said at least one second connection pad being against said at least one connection pad of said wiring board, having a galvanic contact with said connection pad of said wiring board, and having a galvanic contact with said at least one electrical conductor.

28. A communication device according to claim 25, wherein said transducer component is an electro-acoustical transducer and said signal aperture is a sound signal port.

29. A communication device according to claim 28, wherein said electro-acoustical transducer is a microphone component.

30. A communication device according to claim 28, wherein said electro-acoustical transducer is a speaker component.

31. A communication device according to claim 25, wherein said transducer component is a pressure transducer and said signal aperture is a pressure signal port.

32. A communication device according to claim 25, wherein said transducer component is an optoelectronic transducer and the signal aperture is an optical signal port.

33. A communication device according to claim 25, wherein said communication device is one of the following: a mobile phone, a handheld computer, and a portable computer.

34. A method comprising:
- installing a sheet of electrical insulator around a transducer component, at least a part of a surface of a first side of said sheet of electrical insulator getting against a first side of said transducer component and at least one first connection pad on the surface of the first side of said sheet of electrical insulator getting against at least one connection pad at said first side of said transducer component, where the sheet of electrical insulator extends over a second side of the transducer component and past a third side of, said transducer component, and
- producing a galvanic contact between said at least one first connection pad and said at least one connection pad of said transducer component.

35. A method according to claim 34, wherein said sheet of electrical insulator is an overhang of a layer of a wiring board of an electronic device and said at least one first connection pad has a galvanic connection with an electrical conductor of said wiring board.

36. A method according to claim 34, wherein a part of said sheet of electrical insulator is laid between said transducer component and a wiring board of an electronic device, at least one second connection pad on a surface of said part of said sheet of electrical insulator is laid against at least one connection pad of said wiring board, and a galvanic contact is produced between said at least one second connection pad and said at least one connection pad of said wiring board, said at least one connection pad of said wiring board being located on a surface of said wiring board and said at least one second connection pad having a galvanic connection with said at least one first connection pad.

37. A method according to claim 36, wherein the galvanic contact between said at least one second connection pad and said at least one connection pad of said wiring board is produced after the galvanic contact between said at least one first connection pad and said at least one connection pad of said transducer component has been produced.

38. A method according to claim 36, wherein the galvanic contact between said at least one first connection pad and said at least one connection pad of said transducer component is produced after the galvanic contact between said at least one second connection pad and said at least one connection pad of said wiring board has been produced.

39. A method according to claim 34, wherein said galvanic contact between said at least one connection pad of said transducer component and said at least one first connection pad is produced with one of the following welding methods ultrasonic welding, laser welding, electron beam welding, and current pulse welding.

40. A method according to claim 34, further comprising producing a galvanic contact between at least one second connection pad on said electrical insulator and at least one connection pad of a wiring board with one of the following welding methods: ultrasonic welding, laser welding, electron beam welding, and current pulse welding.

41. A method according to claim 34, wherein said galvanic contact between said at least one connection pad of said transducer component and said at least one first connection pad is produced with soldering.

42. A method according to claim 34, wherein said galvanic contact between said at least one connection pad of said transducer component and said at least one first connection pad is produced with printed electrically conductive adhesive material.

43. A method according to claim 34, wherein said galvanic contact between said at least one connection pad of said transducer component and said at least one first connection pad is produced with anisotropic electrically conductive adhesive material.

44. A method according to claim 36, wherein said galvanic contact between said at least one second connection pad and said at least one connection pad of said wiring board is produced with soldering.

45. A method according to claim 36, wherein said galvanic contact between said at least one second connection pad and said at least one connection pad of said wiring board is produced with printed electrically conductive adhesive material.

46. A method according to claim 36, wherein said galvanic contact between said at least one second connection pad and said at least one connection pad of said wiring board is produced with anisotropic electrically conductive adhesive material.

* * * * *